United States Patent
Li

(10) Patent No.: US 10,873,358 B1
(45) Date of Patent: Dec. 22, 2020

(54) CARD READ RESPONSE METHOD, APPARATUS, AND SYSTEM, AND SIGNAL TRANSCEIVING DEVICE

(71) Applicant: TENDYRON CORPORATION, Beijing (CN)

(72) Inventor: Dongsheng Li, Beijing (CN)

(73) Assignee: Tendyron Corporation, Beijing (CN)

( * ) Notice: Subject to any disclaimer, the term of this patent is extended or adjusted under 35 U.S.C. 154(b) by 15 days.

(21) Appl. No.: 16/479,600

(22) PCT Filed: Jan. 4, 2018

(86) PCT No.: PCT/CN2018/071398
§ 371 (c)(1),
(2) Date: Jul. 21, 2019

(87) PCT Pub. No.: WO2018/133676
PCT Pub. Date: Jul. 26, 2018

(30) Foreign Application Priority Data

Jan. 23, 2017 (CN) .......................... 2017 1 0058100
Jan. 23, 2017 (CN) .......................... 2017 1 0058115

(51) Int. Cl.
*H04B 1/40* (2015.01)
*H04B 1/00* (2006.01)
(Continued)

(52) U.S. Cl.
CPC .............. *H04B 1/40* (2013.01); *G06K 7/0008* (2013.01); *H03F 3/211* (2013.01); *H03F 3/24* (2013.01); *H04B 1/005* (2013.01); *H04B 1/0458* (2013.01)

(58) Field of Classification Search
CPC ......... H04B 1/40; H04B 1/0475; H04B 1/525
See application file for complete search history.

(56) References Cited

U.S. PATENT DOCUMENTS 5,764,156 A * 6/1998 Chaloux ............ G06K 7/10336
340/10.34
2008/0065957 A1 3/2008 Shoarinejad
2009/0239490 A1 * 9/2009 Schuchter ........... H04L 27/0012
455/226.2

FOREIGN PATENT DOCUMENTS

CN 103427882 A 12/2013
CN 106941363 A 7/2017
(Continued)

OTHER PUBLICATIONS

International Search Report dated Mar. 28, 2018 for PCT/CN2018/071398.
ISA Written Opinion dated Mar. 28, 2019 for PCT/CN2018/071398.

*Primary Examiner* — Shuwang Liu
*Assistant Examiner* — Gina M McKie
(74) *Attorney, Agent, or Firm* — Martin & Ferraro, LLP

(57) ABSTRACT

A signal responding method includes: receiving a carrier signal with a frequency of 125 KHz via an antenna with a resonance frequency of 13.56 MHz; amplifying the carrier signal and performing analog-to-digital conversion on the amplified carrier signal to obtain a digital signal; acquiring, according to the digital signal, a signal characteristic of the carrier signal which comprises at least a frequency and a phase; and encoding response data at the frequency of the carrier signal to obtain an encoded signal, determining an initial phase to output the encoded signal based on the phase of the carrier signal, and outputting the encoded signal via the antenna, such that the encoded signal and the carrier signal are superposed at a same phase.

20 Claims, 6 Drawing Sheets

(51) Int. Cl.
*H03F 3/24* (2006.01)
*G06K 7/00* (2006.01)
*H03F 3/21* (2006.01)
*H04B 1/04* (2006.01)

(56) References Cited

FOREIGN PATENT DOCUMENTS

| | | |
|---|---|---|
| CN | 107070481 A | 8/2017 |
| CN | 206506524 U | 9/2017 |

* cited by examiner

CARD READ RESPONSE METHOD, APPARATUS, AND SYSTEM, AND SIGNAL TRANSCEIVING DEVICE

CROSS-REFERENCE TO RELATED APPLICATION

This application is a U.S. national phase application of International Application No. PCT/CN2018/071398, filed Jan. 4, 2018, which is based on and claims priority to Chinese Patent Application No. 201710058115.X titled "signal transceiving device", filed on Jan. 23, 2017, and Chinese Patent Application No. 201710058100.3 titled "card-reading response method, device, and system", filed on Jan. 23, 2017, the entire content of which is incorporated herein by reference.

FIELD

The present disclosure relates to the field of electronic technology, and more particularly to a card-read responding method, apparatus, and system, and a signal transceiving device.

BACKGROUND

At present, in order to improve user experiences, radio frequency identification (RFID) cards are increasingly pursuing miniaturization. For an RFID card with a relatively low resonance frequency of 125 kHz, in the card reading process, in order to enable the RFID card to obtain energies sufficient enough and signals with amplitudes larger enough to ensure proper operation of the RFID card, an antenna with a larger size needs to be equipped. However, due to the larger size, the antenna with a frequency of 125 KHz is not suitable for small devices. Therefore, how to make the RFID card with the frequency of 125 KHz work properly and suitable for small devices is an urgent problem to be solved.

SUMMARY

Embodiments of the present disclosure seek to solve the above problems.

In order to achieve the above purposes, technical solutions of the present disclosure are specifically implemented as follows.

In a first aspect of the present disclosure, there is provided a signal transceiving device, including: an antenna coil with a resonance frequency of 13.56 MHz, an amplification circuit, an analog-to-digital conversion circuit, a first direct current DC blocking circuit, a second DC blocking circuit, a DC power supply and a micro control unit MCU. The DC power supply is electrically connected with each of the amplification circuit, the analog-to-digital conversion circuit and the MCU, and configured to supply power to each of the amplification circuit, the analog-to-digital conversion circuit and the MCU; the antenna coil is configured to receive a carrier signal with a frequency of 125 KHz; the second DC blocking circuit is electrically connected with the antenna coil at a first end of the second DC blocking circuit and electrically connected with an input end of the amplification circuit at a second end of the second DC blocking circuit, and configured to transmit the carrier signal to the amplification circuit; the amplification circuit is electrically connected with the second DC blocking circuit at the input end of the amplification circuit, and configured to amplify the carrier signal and output the amplified carrier signal via an output end of the amplification circuit; the analog-to-digital conversion circuit is electrically connected with the output end of the amplification circuit at an input end of the analog-to-digital conversion circuit, and configured to perform analog-to-digital conversion on the carrier signal amplified by the amplification circuit to obtain a digital signal, and output the digital signal via an output end of the analog-to-digital conversion circuit; the MCU is electrically connected with the output end of the analog-to-digital conversion circuit at a receiving port of the MCU, and configured to acquire, according to the digital signal, a signal characteristic of the carrier signal which includes at least a frequency and a phase, encode date to be output at the frequency of the carrier signal to obtain an encoded signal, determine an initial phase to output the encoded signal based on the phase of the carrier signal, and output the encoded signal from a transmitting port of the MCU; and the first DC blocking circuit is electrically connected with the transmitting port of the MCU at a first end of the first DC blocking circuit and electrically connected with the antenna coil at a second end of the first DC blocking circuit, and configured to transmit the encoded signal to the antenna coil.

In another aspect of the present disclosure, there is provided a signal transceiving device, including: an antenna coil with a resonance frequency of 13.56 MHz, an amplification circuit, an analog-to-digital conversion circuit, a first direct current DC blocking circuit, a driving unit, a second DC blocking circuit, a DC power supply and a micro control unit MCU. The DC power supply is electrically connected with each of the amplification circuit, the analog-to-digital conversion circuit, the driving unit and the MCU, and configured to supply power to each of the amplification circuit, the analog-to-digital conversion circuit, the driving unit and the MCU; the antenna coil is configured to receive a carrier signal with a frequency of 125 KHz; the second DC blocking circuit is electrically connected with the antenna coil at a first end of the second DC blocking circuit and electrically connected with an input end of the amplification circuit at a second end of the second DC blocking circuit, and configured to transmit the carrier signal to the amplification circuit; the amplification circuit is electrically connected with the second DC blocking circuit at the input end of the amplification circuit, and configured to amplify the carrier signal and output the amplified carrier signal via an output end of the amplification circuit; the analog-to-digital conversion circuit is electrically connected with the output end of the amplification circuit at an input end of the analog-to-digital conversion circuit, and configured to perform analog-to-digital conversion on the carrier signal amplified by the amplification circuit to obtain a digital signal, and output the digital signal via an output end of the analog-to-digital conversion circuit; the MCU is electrically connected with the output end of the analog-to-digital conversion circuit at a receiving port of the MCU, and configured to acquire, according to the digital signal, a signal characteristic of the carrier signal which includes at least a frequency and a phase, encode date to be output at the frequency of the carrier signal to obtain an encoded signal, determine an initial phase to output the encoded signal based on the phase of the carrier signal, and output a control signal from a transmitting port of the MCU according to the encoded signal and the initial phase; the driving unit is electrically connected with the transmitting port of the MCU at an input end of the driving unit and electrically connected with the first DC blocking circuit at an output end of the driving unit, and configured to output the encoded signal from the output end of the driving unit under control of the control signal; and the first DC blocking circuit is electrically connected with the output end of the driving unit at a first end of the first DC blocking circuit and electrically connected with the antenna coil at a second end of the first DC blocking circuit, and configured to transmit the encoded signal to the antenna coil.

Alternatively, the driving unit includes an on-off module, and the on-off module includes: a first end, a second end, and a control end. The control end is the input end of the driving unit and electrically connected with the transmitting port of the MCU; the first end is the output end of the driving unit, and electrically connected with each of the first DC blocking circuit and the DC power supply; the second end is electrically connected with a ground terminal; and the on-off module is configured to turn on or off an electrical connection between the first end and the second end of the on-off module under control of the control signal.

Alternatively, the analog-to-digital conversion circuit includes an A/D sampling circuit or a voltage comparing circuit.

Alternatively, the signal transceiving device further includes: a transceiving circuit, electrically connected with the antenna coil, and configured to receive and transmit signals with a frequency of 13.56 MHz; and a card reader and card chip with a frequency of 13.56 MHz, electrically connected with the transceiving circuit, and configured to analyze a signal received by the transceiving circuit and encode a signal transmitted by the transceiving circuit.

Alternatively, the signal transceiving device further includes: a rectifying unit, electrically connected with the antenna coil at an input end of the rectifying unit, and configured to receive and rectify an alternating current AC signal output by the antenna coil, and output a DC signal via an output end of the rectifying unit.

Alternatively, the signal transceiving device further includes: a charging port, electrically connected with the output end of the rectifying unit, and configured to obtain electrical energy from the rectifying unit.

Alternatively, the signal transceiving device further includes: a switching unit, electrically connected between the output end of the rectifying unit and the charging port, and configured to turn on or off an electrical connection between the rectifying unit and the charging port.

In a further aspect of the present disclosure, there is provide a signal responding method, including: receiving a carrier signal with a frequency of 125 KHz via an antenna with a resonance frequency of 13.56 MHz; amplifying the carrier signal and performing analog-to-digital conversion on the amplified carrier signal to obtain a digital signal; acquiring, according to the digital signal, a signal characteristic of the carrier signal which includes at least a frequency and a phase; and encoding response data at the frequency of the carrier signal to obtain an encoded signal, determining an initial phase to output the encoded signal based on the phase of the carrier signal, and outputting the encoded signal via the antenna, such that the encoded signal and the carrier signal are superposed at a same phase.

Further, a phase difference between the initial phase and the phase of the carrier signal is 0.

Further, the response data is a unique identification number.

In yet another aspect of the present disclosure, there is provided a signal responding apparatus, including: a receiving module, configured to receive a carrier signal with a frequency of 125 KHz via an antenna with a resonance frequency of 13.56 MHz; a signal processing module, configured to amplify the carrier signal and perform analog-to-digital conversion on the amplified carrier signal to obtain a digital signal; an acquiring module, configured to acquire, according to the digital signal, a signal characteristic of the carrier signal which includes at least a frequency and a phase; and an outputting module, configured to encode response data at the frequency of the carrier signal to obtain an encoded signal, determine an initial phase to output the encoded signal based on the phase of the carrier signal, and output the encoded signal via the antenna, such that the encoded signal and the carrier signal are superposed at a same phase.

Further, a phase difference between the initial phase and the phase of the carrier signal is 0.

Further, the response data is a unique identification number.

Further, the signal processing module includes at least an amplifier and a comparator; or the signal processing module includes at least an amplifier and a sampling circuit.

In still yet another aspect of the present disclosure, there is provided a signal responding system, including: a signal responding apparatus as described above; and a read/write apparatus, configured to transmit a carrier signal with a frequency of 125 KHz and receive an encoded signal.

BRIEF DESCRIPTION OF THE DRAWINGS

In order to illustrate technical solutions as described in embodiments of the present disclosure more clearly, figures which will be referred in the description of embodiments will be briefly described below. Clearly, the figures mentioned in the following description only involve some embodiments of the present disclosure, and other figures are obtainable by those skilled in the art based on these figures, without inventive work.

DETAILED DESCRIPTION

In the following, some embodiments of the present disclosure will be described clearly and completely with reference to accompanying drawings. Clearly, it will be understand that these embodiments are only a part of embodiments of the present disclosure, and other embodiments obtainable by those skilled in the art based on these embodiments without inventive work should belong to the protection scope of the present disclosure.

The present disclosure will be described in detail below with reference to drawings and embodiments.

Embodiment 1

This embodiment provides a signal transceiving device.

Figure 1:
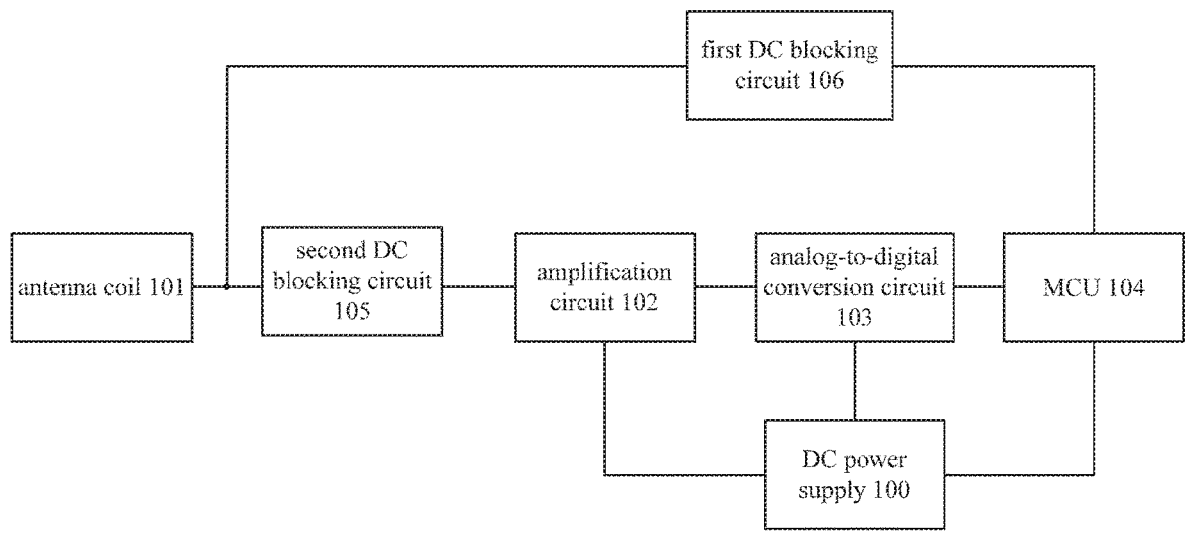
FIG. 1 is a schematic diagram of a signal transceiving device according to Embodiment 1 of the present disclosure.

FIG. 1 is a schematic diagram of a signal transceiving device provided according to this embodiment of the present disclosure. As illustrated in FIG. 1, the signal transceiving device mainly includes: an antenna coil 101 with a resonance frequency of 13.56 MHz, an amplification circuit 102, an analog-to-digital conversion circuit 103, a first DC blocking circuit 106, a second DC blocking circuit 105, a DC power supply 100 and a MCU 104.

Connection relationships and functions of the various components of the signal transceiving device provided according to this embodiment will be illustrated below.

The DC power supply 100 is electrically connected with each of the amplification circuit 102, the analog-to-digital conversion circuit 103 and the MCU 104, and configured to supply power to each of the amplification circuit 102, the analog-to-digital conversion circuit 103 and the MCU 104. The antenna coil 101 is configured to receive a carrier signal with a frequency of 125 KHz. The second DC blocking circuit 105 is electrically connected with the antenna coil 101 at a first end of the second DC blocking circuit 105 and electrically connected with an input end of the amplification circuit 102 at a second end of the second DC blocking circuit 105; and configured to transmit the carrier signal to the amplification circuit 102. The amplification circuit 102 is electrically connected with the second DC blocking circuit 105 at the input end of the amplification circuit 102; and configured to amplify the carrier signal with the frequency of 125 KHz received by the antenna coil 101 and output the amplified carrier signal via an output end of the amplification circuit 102. The analog-to-digital conversion circuit 103 is electrically connected with the output end of the amplification circuit 102 at an input end of the analog-to-digital conversion circuit 103, and configured to perform analog-to-digital conversion on the carrier signal amplified by the amplification circuit 102 to obtain a digital signal, and output the digital signal via an output end of the analog-to-digital conversion circuit 103. The MCU 104 is electrically connected with the output end of the analog-to-digital conversion circuit 103 at a receiving port of the MCU 104, and configured to: acquire, according to the digital signal, a signal characteristic of the carrier signal which includes at least a frequency and a phase, encode date to be output at the frequency of the carrier signal to obtain an encoded signal, determine an initial phase to output the encoded signal based on the phase of the carrier signal, and output the encoded signal from a transmitting port of the MCU 104. The first DC blocking circuit 106 is electrically connected with the transmitting port of the MCU 104 at a first end of the first DC blocking circuit 106 and electrically connected with the antenna coil 101 at a second end of the first DC blocking circuit 106, and configured to transmit the encoded signal to the antenna coil 101, and the encoded signal is further transmitted by the antenna coil 101.

In this embodiment, since the antenna coil with the resonance frequency of 13.56 MHz has a lower size than an antenna coil with a resonance frequency of 125 KHz, the antenna coil with the resonance frequency of 13.56 MHz may be applied to a small device, so as to prevent influence of an overlarge antenna coil on miniaturization design. Therefore, in this embodiment, the signal transceiving device is provided with the antenna coil with the resonance frequency of 13.56 MHz, and performs signal reception and transmission through the antenna coil with the resonance frequency of 13.56 MHz. In addition, in order to enable the signal transceiving device to identify the carrier signal with the frequency of 125 KHz, the signal transceiving device according to this embodiment is provided with the amplification circuit 102 to amplify the carrier signal with the frequency of 125 KHz received by the antenna coil 101, the amplified carrier signal is converted by the analog-to-digital conversion circuit 103 into the digital signal, such that the MCU 104 is capable of identifying the digital signal input therein and acquiring the frequency and phase of the carrier signal transmitted by a sender, and then actively returns response data (i.e., the data to be output as described above) to the sender. When encoding the response data, the MCU 104 encodes the response data at the acquired frequency of the carrier signal, determines the initial phase to output the encoded signal according to the phase of the carrier signal transmitted by the sender, and transmits the encoded signal to the antenna coil 101 via the first DC blocking circuit 106, and the encoded signal is further transmitted by the antenna coil 101.

In an alternative implementation of the present disclosure, the response data transmitted by the MCU 104 may be a unique identification number of an RFID card, such as a unique electronic code of an RFID tag, etc.

In this embodiment, in order to enable the amplification circuit 102, the analog-to-digital conversion circuit 103 and the MCU 104 to work properly, the signal transceiving device is provided with the DC power supply 100. In addition, in order to avoid the influence of an electrical signal of the DC power supply 100 on signal transmission and reception of the antenna coil 101, in this embodiment, the first DC blocking circuit 106 is set between the MCU 104 and the antenna coil 101, and the second DC blocking circuit 105 is set between the amplification circuit 102 and the antenna coil 101, such that the DC electrical signal cannot be transmitted to the antenna coil 101, thereby avoiding the influence of the DC electrical signal of the DC power supply 100 on the signal transmission and reception of the antenna coil 101.

It should be illustrated that, the resonance frequency of 13.56 MHz as described in this embodiment is not limited to 13.56 MHz only. Due to different characteristics of antenna coils, the antenna coil with the resonance frequency of 13.56 MHz should be understood broadly herein, which means that any antenna coil with a resonance frequency near 13.56 MHz should belong to the antenna coil with the resonance frequency of 13.56 MHz as described in this embodiment. For example, an antenna coil with a resonance frequency within the range of 13.56 MHz 7 KHz should belong to the antenna coil with the resonance frequency of 13.56 MHz as described in this embodiment. Similarly, the carrier signal with the frequency of 125 KHz as described in this embodiment is not limited to the frequency of 125 KHz only. Due to different characteristics of carrier signal transmitting apparatuses (such as read/write apparatuses), the carrier signal with the frequency of 125 KHz transmitted thereby should be understood broadly herein, which means that any carrier signal with a frequency near 125 KHz should belong to the carrier signal with the frequency of 125 KHz as described in this embodiment. For example, a carrier signal with a frequency within the range of 125 KHz n KHz should belong to the carrier signal with the frequency of 125 KHz as described in this embodiment, where n is a preset value.

As the frequency of the carrier signal transmitted by the carrier signal transmitting apparatus is 125 KHz, while the resonance frequency of the antenna coil 101 is 13.56 MHz, the amplitude of the carrier signal received by the antenna with the resonance frequency of 13.56 MHz is too small to be identified by the signal transceiving device. Therefore, the carrier signal received by the antenna coil 101 needs to be amplified by the amplification circuit 102, thereby amplifying the amplitude of the carrier signal to enable the MCU 104 to identify the carrier signal. After amplifying the carrier signal, the amplification circuit 102 inputs the amplified carrier signal (such as a sine wave) to the analog-to-digital conversion circuit 103 where the carrier signal is subjected to the analog-to-digital conversion to form the digital signal (such as a square wave), thereby obtaining transmission information of the carrier signal transmitting apparatus. The transmission information may include information in a preset format for instructing the signal transceiving device to make a response, and may also include data transmitted to the signal transceiving device, which is not specifically limited in this embodiment.

In an alternative implementation of the present disclosure, when the MCU 104 determines the initial phase to output the encoded signal according to the phase of the carrier signal transmitted by the sender, in order to make the signal transmitted by the signal transceiving device easy to be detected by the sender, a phase difference between the initial phase and the phase of the carrier signal may be set to be 0, such that the encoded signal and the carrier signal are completely coincident and superposed at a same phase to enhance the amplitude of the carrier signal, thereby facilitating the carrier signal transmitting apparatus to acquire the signal transmitted by the signal transceiving device.

In this embodiment, the DC blocking circuits (including the first DC blocking circuit and the second DC blocking circuit) as described above may consist of one or more DC blocking capacitors, which is not specifically limited in this embodiment.

In an alternative implementation of the present disclosure, the amplification circuit 102 may be implemented by an amplifier and a load. In a specific application, a resistance of the load may be set according to a magnification as required.

In an alternative implementation of the present disclosure, the analog-to-digital conversion circuit 103 may be implemented by an A/D sampling circuit or a voltage comparing circuit, which may be selected as required.

Figure 2:
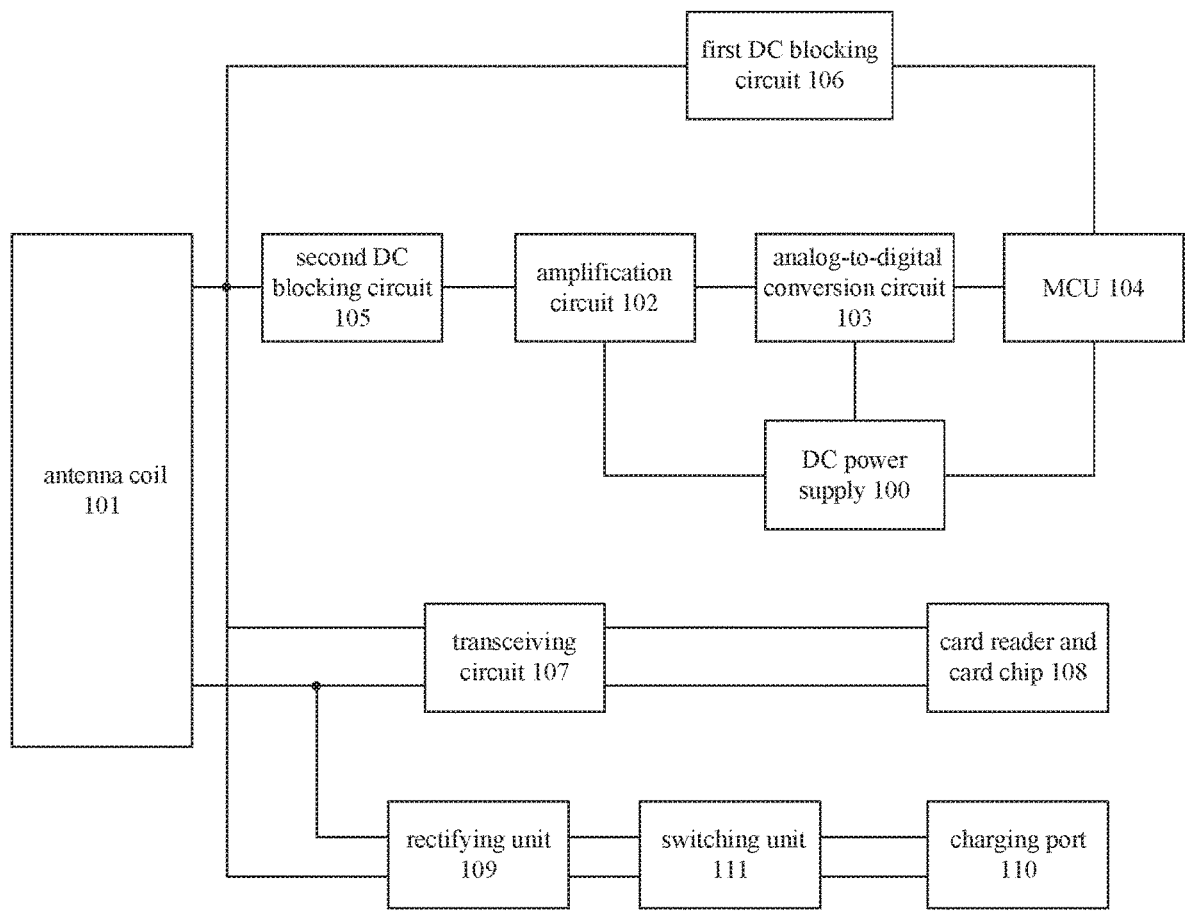
FIG. 2 is a schematic diagram of another signal transceiving device according to Embodiment 1 of the present disclosure.

In an alternative implementation of the present disclosure, as illustrated in FIG. 2, the signal transceiving device may further include a transceiving circuit 107; and a card reader and card chip 108 with a frequency of 13.56 MHz. The transceiving circuit 107 is electrically connected with the antenna coil 101 and configured to receive and transmit signals with a frequency of 13.56 MHz. The card reader and card chip 108 is electrically connected with the transceiving circuit 107, and configured to analyze a signal received by the transceiving circuit 107 and encode a signal transmitted by the transceiving circuit 107. In this alternative implementation, the signal transceiving device is further provided with the transceiving circuit 107 for receiving and transmitting signals with the frequency of 13.56 MHz and the card reader and card chip 108 for analyzing the received signal with the frequency of 13.56 MHz and encoding the transmitted signal with the frequency of 13.56 MHz. That is, in this alternative implementation, the signal transceiving device has the following functions at the same time: a card reader with a frequency of 13.56 MHz, a card chip with a frequency of 13.56 MHz, and a card chip with a frequency of 125 KHz. With this alternative implementation, the function of the signal transceiving device is extended, such that a 13.56 MHz card reader mode, a 13.56 MHz card chip mode, and a 125 KHz card chip mode may be integrated in the same device, and the three modes share the same antenna coil, thereby saving costs.

In the above alternative implementation, the card reader and card chip 108 may include three external ports: a transmitting port of the card reader with the frequency of 13.56 MHz, a transmitting port of the card chip with the frequency of 13.56 MHz, and a receiving port with the frequency of 13.56 MHz. The transceiving circuit 107 may include three branches: a transmitting branch of the card reader with the frequency of 13.56 MHz, a transmitting branch of the card chip with the frequency of 13.56 MHz, and a receiving branch with the frequency of 13.56 MHz. A first end of each of the three branches is electrically connected with the antenna coil 101, a second end of the transmitting branch of the card reader with the frequency of 13.56 MHz is electrically connected with the transmitting port of the card reader with the frequency of 13.56 MHz of the card reader and card chip 108, a second end of the transmitting branch of the card chip with the frequency of 13.56 MHz is electrically connected with the transmitting port of the card chip with the frequency of 13.56 MHz of the card reader and card chip 108, and a second end of the receiving branch with the frequency of 13.56 MHz is electrically connected with the receiving port with the frequency of 13.56 MHz of the card reader and card chip 108. That is, in the above alternative implementation, the card reader with the frequency of 13.56 MHz and the card chip with the frequency of 13.56 MHz share the same receiving branch, but use different transmitting branches.

In an alternative implementation of the present disclosure, in order to make the transmission and reception of signals with the frequency of 13.56 MHz more precise, the signal transceiving device may further be provided with a resonance circuit to improve the accuracy of signal transmission and reception.

In an alternative implementation of the present disclosure, in order to make full use of resources, as illustrated in FIG. 2, the signal transceiving device may further include a rectifying unit 109. The rectifying unit 109 is electrically connected with the antenna coil 101 at an input end of the rectifying unit 109, and configured to receive and rectify an AC signal output by the antenna coil 101, and output a DC electrical signal via an output end of the rectifying unit 109. In this embodiment, after rectifying the AC signal, the rectifying unit 109 outputs the DC electrical signal supporting the operation of an electronic device. Therefore, when communicating with other devices in the near field, the signal transceiving device according to this alternative implementation may take power from the antenna coil 101 of the signal transceiving device to support the operation of the signal transceiving device, or charge a built-in power supply of the signal transceiving device, thereby improving the utilization of the signal transceiving device.

Figure 3:
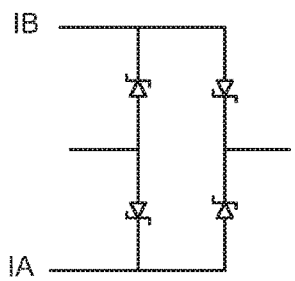
FIG. 3 is a schematic circuit diagram of a rectifying unit according to Embodiment 1 of the present disclosure.

In a specific application, the rectifying unit 109 may be implemented by a bridge circuit. In an alternative implementation of this embodiment, the rectifying unit 109 may use a bridge circuit as shown in FIG. 3, a full-wave rectifying circuit may be obtained by adding a "bridge" structure formed by two diodes, a first end IB of the diode rectifying bridge is electrically connected with a first end of the antenna coil 101, and a second end IA of the diode rectifying bridge is electrically connected with a second end of the antenna coil 101. Of course, the rectifying unit 109 of the present disclosure is not limited thereto, and may be implemented by other circuits in practices, which will not be specifically limited in this embodiment.

In an alternative implementation of the present disclosure, as illustrated in FIG. 2, the signal transceiving device may further include a charging port 110. The charging port 110 is electrically connected with the output end of the rectifying unit, and configured to obtain electrical energy from the rectifying unit. In this alternative implementation, the signal transceiving device may use the DC electrical signal output by the rectifying unit 109 to charge the built-in power supply (such as the DC power supply 100) of the signal transceiving device, thereby improving the utilization of the signal transceiving device.

In an alternative implementation of the present disclosure, as illustrated in FIG. 2, in order to avoid the influence of power taking on the communication between an external device and the signal transceiving device, the signal transceiving device may further include a switching unit 111. The switching unit 111 is electrically connected between the output end of the rectifying unit 109 and the charging port 110, and configured to turn on or off an electrical connection between the rectifying unit 109 and the charging port 110. The switching unit 111 may turn on or off the electrical connection between the rectifying unit 109 and the charging port 110 according to a received control signal. When receiving a control signal instructing to cut off a path between the rectifying unit 109 and the charging port 110, the switching unit 111 cuts off the path between the rectifying unit 109 and the charging port 110. As a result, the path between the rectifying unit 109 and the charging port 110 is disconnected, due to no influence caused by charging, the transmission and reception of the carrier signal by the antenna coil 101 is guaranteed.

Figure 4:
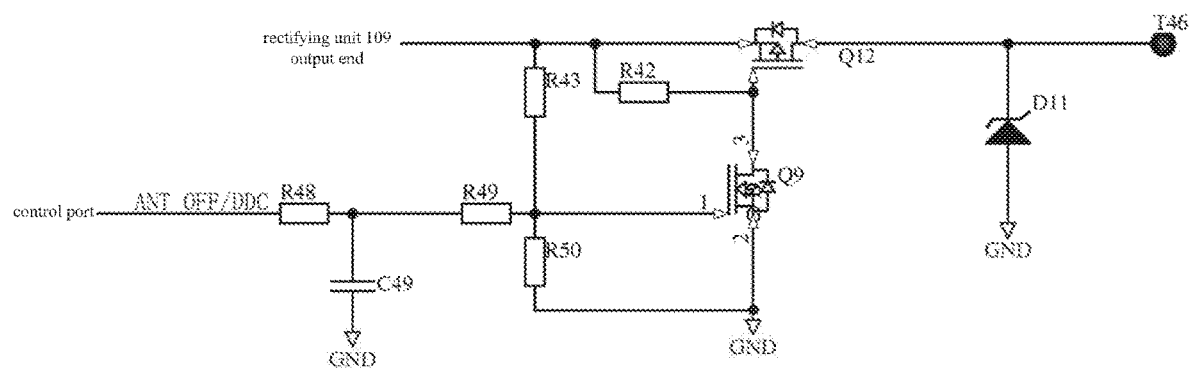
FIG. 4 is a schematic circuit diagram of a switching unit according to Embodiment 1 of the present disclosure.

In a specific implementation, the switching unit 111 may be implemented by an N-channel MOS transistor and a peripheral circuit. FIG. 4 is a schematic circuit diagram of the switching unit 111 according to this embodiment of the present disclosure, as illustrated in FIG. 4, the switching unit 111 includes two NMOS transistors Q9 and Q12, and the Q9 controls the Q12 to turn on or off according to an antenna turning on/off signal input from an turning-on/off control port of an antenna (ANT_OFF/DDC), such that a path between a charging port T46 and the rectifying unit 109 is connected or disconnected.

Figure 5:
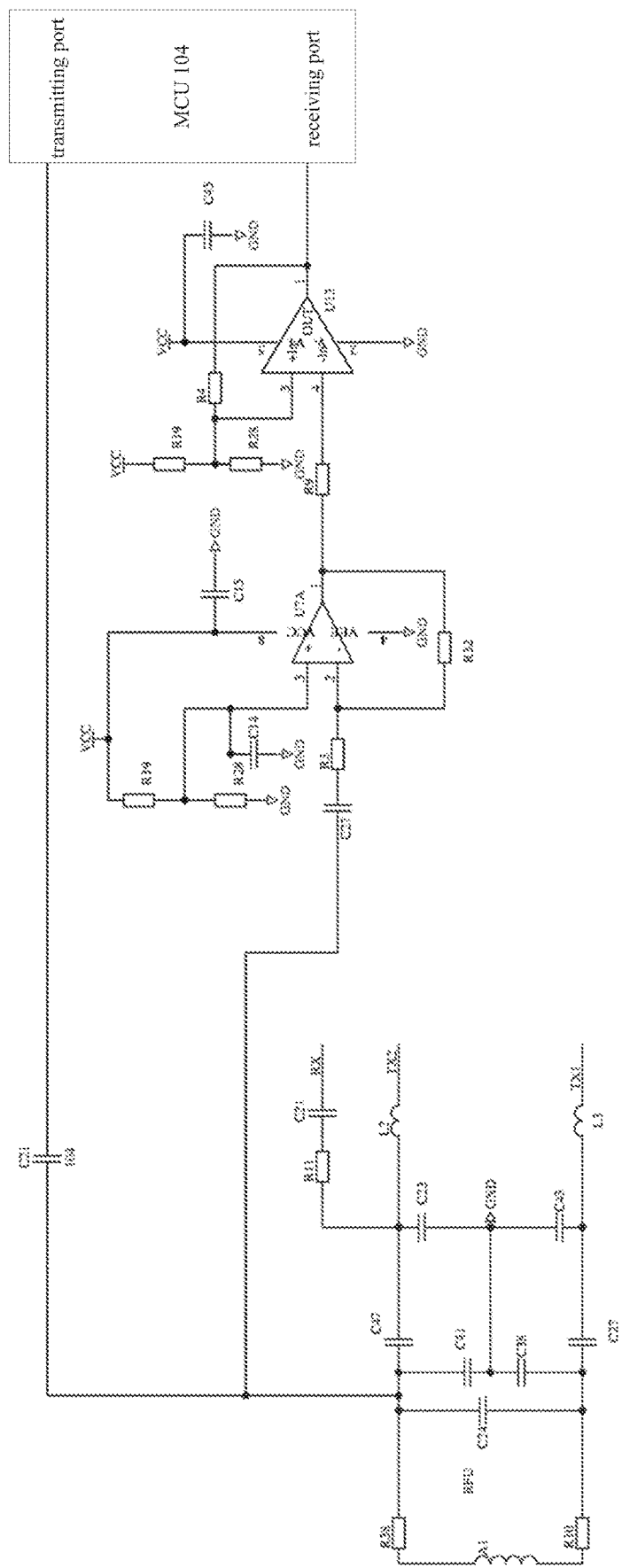
FIG. 5 is a schematic circuit diagram of a signal transceiving device according to Embodiment 1 of the present disclosure.

FIG. 5 is a schematic circuit diagram of the signal transceiving device according to this embodiment, as illustrated in FIG. 5, the amplification circuit 102 includes an amplifier U7A, a capacitor C14, resistors R3 and R32, and a capacitor C15; and the analog-to-digital conversion circuit 103 includes a resistor R4, a voltage comparator U13, and a capacitor C45. In FIG. 5, the DC power supply 100 is indicated by VCC, and the VCC provides bias voltages for the amplifier U7A and the comparator U13 via bias resistors R19 and R28. A reference voltage of the comparator U13 may be determined according to a voltage at a bias point (i.e., a voltage at a connection point of the resistors R19 and R28). The MCU 104 may determine the phase of the received carrier signal according to a voltage inversing point input by the comparator U13. The first DC blocking circuit 106 is implemented by a capacitor C21, the second DC blocking circuit 105 is implemented by a capacitor C27, and the antenna coil 101 is a coil A1. Alternatively, the antenna coil 101 may further include resistors R38 and R10. In addition, the transmitting branch of the card chip with the frequency of 13.56 MHz and the transmitting branch of the card reader with the frequency of 13.56 MHz of the signal transceiving device include an inductor L2 and an inductor L3, respectively. The receiving branch with the frequency of 13.56 MHz includes a resistor R11 and a capacitor C21. TX1, TX2 and RX are electrically connected with the external ports of the card reader and card chip 108, respectively. Between the antenna coil A1 and the three branches with the frequency of 13.56 MHz (i.e., the transmitting branch of the card chip, the transmitting branch of the card reader and the receiving branch), there is provide the resonance circuit, which consists of capacitors C24, C41, C38, C23 and C43, connection relationships among these capacitors are shown in FIG. 5 and will not be elaborated herein.

In the signal transceiving device as illustrated in FIG. 5, when the antenna coil A1 receives a carrier signal with a frequency of 125 kHz, the carrier signal is amplified by the amplifier U7A in amplitude, and then input to the voltage comparator U13; the voltage comparator U13 compares an input voltage with the reference voltage, and outputs a square signal based on a comparison result; the MCU 104 is capable of determining an actual frequency and phase of the received 125 kHz carrier signal according to the input square signal, encodes a signal to be output to obtain an encoded signal consistent with the actual frequency of the received 125 kHz carrier signal, determines an initial phase of the encoded signal according to the phase of the received 125 kHz carrier signal, and outputs the encoded signal from the transmitting port of the MCU 104, and the encoded signal is transmitted via the capacitor C21 to the antenna coil A1, superimposed with the carrier signal and is further transmitted by the antenna coil A1. When the antenna coil A1 receives a carrier signal with a frequency of 13.56 MHz, the carrier signal is input from the RX port to the card reader and card chip with the frequency of 13.56 MHz via the R11 and C21, and is identified by the chip to determine which of the card reader and the chip the carrier signal corresponds to and further determine a corresponding response signal, and the response signal is transmitted by a corresponding transmitting branch. If the received carrier signal is a signal of the card chip, it is determined that the carrier signal is a signal corresponding to the card chip, then corresponding response data is determined to form the response signal, and the response signal is output via the transmitting branch L3 of the card chip to the antenna coil A1, and the encoded signal is further transmitted by the antenna coil A1.

With the signal transceiving device according to this embodiment, the antenna coil with the resonance frequency of 13.56 MHz is used, the received carrier signal with the frequency of 125 KHz is amplified by the amplification circuit, such that the MCU is capable of identifying the received carrier signal with the frequency of 125 KHz, thereby achieving the reception of the carrier signal with the frequency of 125 KHz. Further, the MCU is capable of analyzing the received carrier signal with the frequency of 125 KHz to obtain the frequency and phase of the carrier signal transmitted by the sender, and further encodes the response signal, and outputs the encoded information matched with the frequency and phase of the carrier signal transmitted by the sender via the antenna coil with the resonance frequency of 13.56 MHz, thereby achieving the transmission of the carrier signal with the frequency of 125 KHz through the antenna coil with the resonance frequency of 13.56 MHz. Moreover, thanks to the antenna coil with the resonance frequency of 13.56 MHz, it is ensured that the RFID card is suitable for small devices. In addition, the card reader and card chip with the frequency of 13.56 MHz are compatible in the signal transceiving device, thereby improving integration degree of the device and saving costs.

Embodiment 2

This embodiment provides a signal transceiving device.

Figure 6:
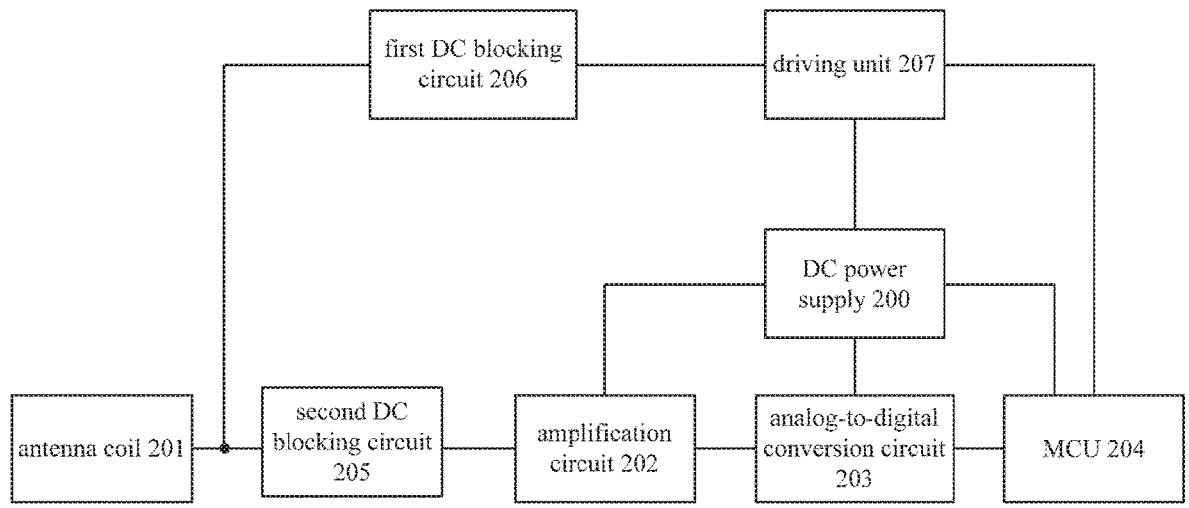
FIG. 6 is a schematic diagram of a signal transceiving device according to Embodiment 2 of the present disclosure.

FIG. 6 is a schematic diagram of a signal transceiving device according to this embodiment, as illustrated in FIG. 6, the signal transceiving device mainly includes: an antenna coil 201 with a resonance frequency of 13.56 MHz, an amplification circuit 202, an analog-to-digital conversion circuit 203, a first DC blocking circuit 206, a driving unit, a second DC blocking circuit 205, a DC power supply 200 and an MCU 204.

Connection relationships and functions of the various components of the signal transceiving device provided in this embodiment will be described below.

The DC power supply 200 is electrically connected with each of the amplification circuit 202, the analog-to-digital conversion circuit 203, the driving unit and the MCU 204, and configured to supply power to each of the amplification circuit 202, the analog-to-digital conversion circuit 203, the driving unit and the MCU 204. The antenna coil 201 is configured to receive a carrier signal with a frequency of 125 KHz. The second DC blocking circuit 205 is electrically connected with the antenna coil 201 at a first end of the second DC blocking circuit 205 and electrically connected with an input end of the amplification circuit 202 at a second end of the second DC blocking circuit 205, and configured to transmit the carrier signal to the amplification circuit 202. The amplification circuit 202 is electrically connected with the second DC blocking circuit 205 at the input end of the amplification circuit 202, and configured to amplify the carrier signal and output the amplified carrier signal via an output end of the amplification circuit 202. The analog-to-digital conversion circuit 203 is electrically connected with the output end of the amplification circuit 202 at an input end of the analog-to-digital conversion circuit 203, and configured to perform analog-to-digital conversion on the carrier signal amplified by the amplification circuit 202 to obtain a digital signal, and output the digital signal via an output end of the analog-to-digital conversion circuit 203. The MCU 204 is electrically connected with the output end of the analog-to-digital conversion circuit 203 at a receiving port of the MCU 204, and configured to: acquire, according to the digital signal, a signal characteristic of the carrier signal which includes at least a frequency and a phase, encode date to be output at the frequency of the carrier signal to obtain an encoded signal, determine an initial phase to output the encoded signal based on the phase of the carrier signal, and output a control signal from a transmitting port of the MCU 204 according to the encoded signal and the initial phase. The driving unit 207 is electrically connected with the transmitting port of the MCU 204 at an input end of the driving unit 207 and electrically connected with the first DC blocking circuit 206 at an output end of the driving unit 207, and configured to output the encoded signal from the output end of the driving unit under control of the control signal. The first DC blocking circuit 206 is electrically connected with the output end of the driving unit at a first end of the first DC blocking circuit 206 and electrically connected with the antenna coil 201 at a second end of the first DC blocking circuit 206, and configured to transmit the encoded signal to the antenna coil 201, and the encoded signal is further transmitted by the antenna coil 201.

As can be seen, a difference between the signal transceiving device provided in this embodiment and that provided in Embodiment 1 lies in that, in Embodiment 1, the MCU 104 directly outputs the encoded signal according to the data to be output and the actual frequency and phase of the received carrier signal with the frequency of 125 KHz, while in this embodiment, the MCU 204 outputs the control signal according to the data to be output and the actual frequency and phase of the received carrier signal with the frequency of 125 KHz to control the driving unit 207 to output the encoded signal via the output end of driving unit 207. Embodiment 1 is applicable to the case where an operating voltage of the MCU enables the encoded signal output by the MCU to be identified by the sender of the carrier signal with the frequency of 125 kHz, while this embodiment is applicable to the case where an operating voltage of the MCU is not enough to enable the encoded signal output by the MCU to be identified by the sender of the carrier signal with the frequency of 125 kHz, and through the driving unit 207, a voltage of the encoded signal becomes large enough to enable the encoded signal to be identified by the sender of the carrier signal with the frequency of 125 kHz.

In the following, descriptions are mainly made on differences between the signal transceiving device according this embodiment and that according to Embodiment 1. With respect to other components of the signal transceiving device according this embodiment, reference may be made to related descriptions in Embodiment 1, which will not be elaborated herein.

Figure 7:
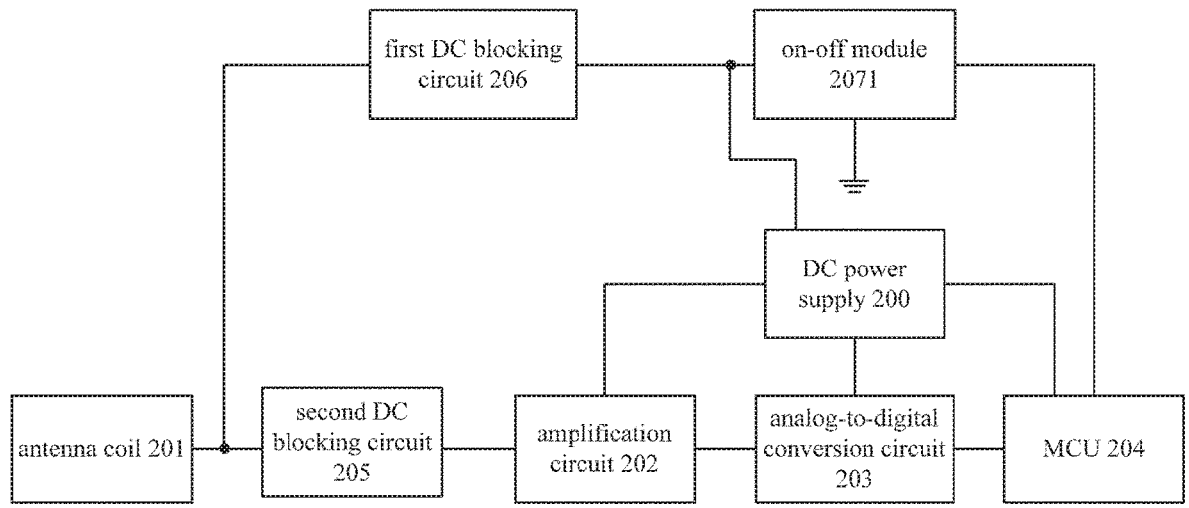
FIG. 7 is a schematic diagram of another signal transceiving device according to Embodiment 2 of the present disclosure.

In an alternative implementation of the present disclosure, as illustrated in FIG. 7, the driving unit 207 may be implemented by an on-off module 2071. The on-off module 2071 may include a first end, a second end and a control end. The control end is the input end of the driving unit 207 and electrically connected with the transmitting port of the MCU 204. The first end is the output end of the driving unit 207, and electrically connected with each of the first DC blocking circuit 206 and the DC power supply. The second end is electrically connected with a ground terminal. The on-off module 2071 is configured to turn on or off an electrical connection between the first end and the second end of the on-off module 2071 under control of the control signal output by the MCU 204, such that the first end of the on-off module 2071 outputs a high electrical level (i.e., an electrical level at a positive end of the DC power supply) or a low electrical level (0 relative level). That is, the first end of the on-off module 2071 outputs a square signal, and a frequency of the square signal is the same as the actual frequency of the received 125 KHz carrier signal. The square signal is input to the antenna coil 201 via the first DC blocking circuit 206, and superimposed with the carrier signal to enhance the amplitude of the carrier signal, so that the date transmitted by the signal transceiving device can be detected by the carrier signal transmitting apparatus.

Further, alternatively, a phase difference between a phase of the above square signal and the phase of the received carrier signal with the frequency of 125 KHz is 0, such that the encoded signal and the carrier signal are completely coincident and superposed at a same phase to enhance the amplitude of the carrier signal, thereby facilitating the carrier signal transmitting apparatus to acquire the signal transmitted by the signal transceiving device.

In a specific implementation, the on-off module 2071 may be implemented by an N-channel MOS transistor or a P-channel MOS transistor, which will not be specifically limited in this embodiment.

With the signal transceiving device according to this embodiment, the antenna coil with the resonance frequency of 13.56 MHz is used, the received carrier signal with the frequency of 125 KHz is amplified by the amplification circuit, such that the MCU is capable of identifying the received carrier signal with the frequency of 125 KHz, thereby achieving the reception of the carrier signal with the frequency of 125 KHz. Further, the MCU is capable of analyzing the received carrier signal with the frequency of 125 KHz to obtain the frequency and phase of the carrier signal transmitted by the sender, and further encodes the response signal, so as to control the driving unit to output the encoded information matched with the frequency and phase of the carrier signal transmitted by the sender via the antenna coil with the resonance frequency of 13.56 MHz, thereby achieving the transmission of the carrier signal with the frequency of 125 KHz through the antenna coil with the resonance frequency of 13.56 MHz. Moreover, thanks to the antenna coil with the resonance frequency of 13.56 MHz, it is ensured that the RFID card is suitable for small devices. In addition, the card reader and card chip with the frequency of 13.56 MHz are compatible in the signal transceiving device, thereby improving integration degree of the device and saving costs.

Embodiment 3

Figure 8:
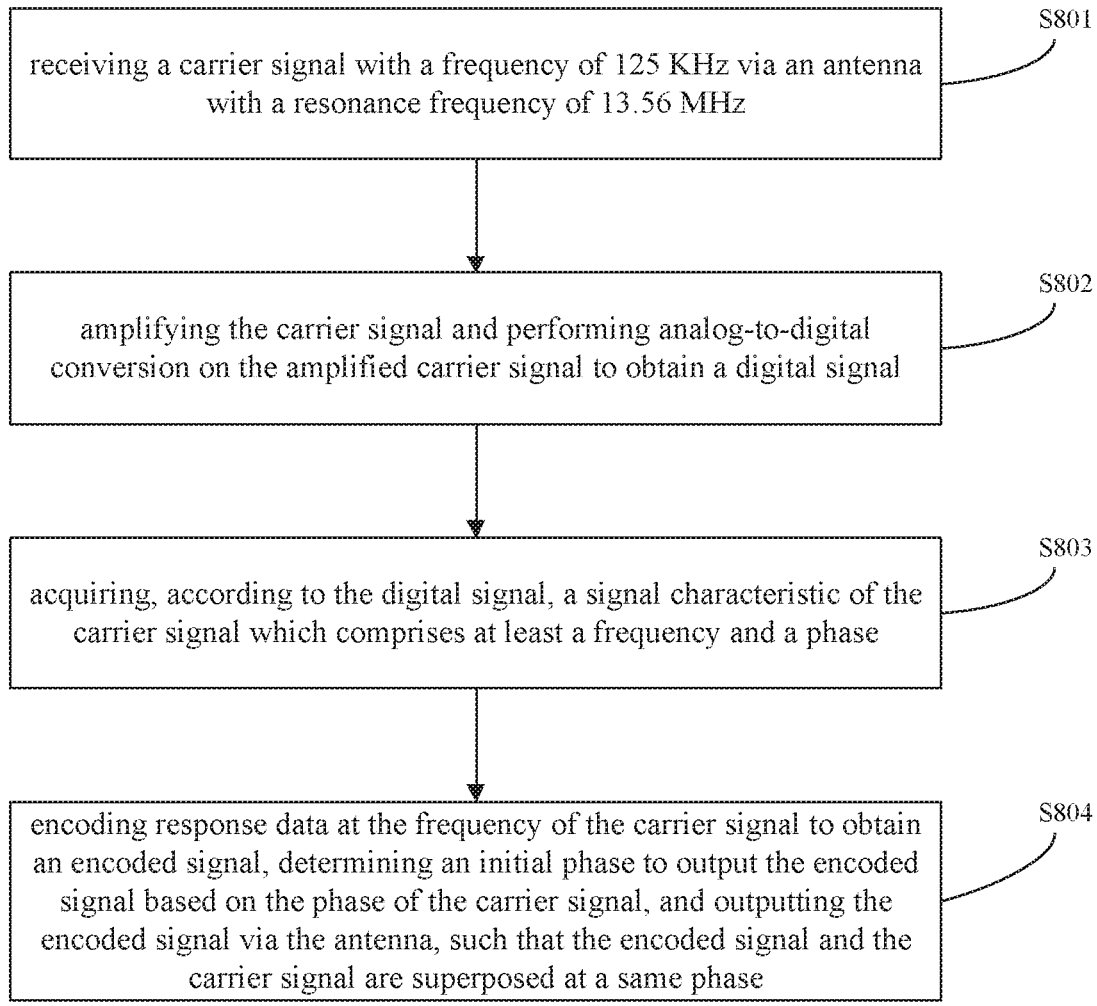
FIG. 8 is a flow chart of a signal responding method according to Embodiment 3 of the present disclosure.

This embodiment provides a signal responding method. FIG. 8 shows a flow chart of a signal responding method according to an embodiment of the present disclosure, as illustrated in FIG. 8, the signal responding method according to an embodiment of the present disclosure includes the followings.

At S801, a carrier signal with a frequency of 125 KHz is received via an antenna with a resonance frequency of 13.56 MHz.

Since the antenna with the resonance frequency of 13.56 MHz is smaller than an antenna with a resonance frequency of 125 KHz in size, the antenna with the resonance frequency of 13.56 MHz may be applied to a small device, so as to prevent influence of an overlarge antenna on miniaturization design. Therefore, in embodiments of the present disclosure, a signal responding apparatus is provided with the antenna with the resonance frequency of 13.56 MHz to perform signal reception and transmission through the antenna with the resonance frequency of 13.56 MHz. Of course, the antenna with the resonance frequency of 13.56 MHz provided according to the present disclosure is capable of normally receiving a carrier signal with a frequency of 13.56 MHz, so that dual mode may be realized by the device.

It should be illustrated that, the resonance frequency of 13.56 MHz as described in embodiments of the present disclosure is not limited to 13.56 MHz only. Due to different characteristics of antennas, the antenna with the resonance frequency of 13.56 MHz should be understood broadly herein, which means that any antenna with a resonance frequency near 13.56 MHz should belong to the antenna with the resonance frequency of 13.56 MHz as described in embodiments of the present disclosure. For example, an antenna with a resonance frequency within the range of 13.56 MHz±7 KHz should belong to the antenna with the resonance frequency of 13.56 MHz as described in present disclosure. Similarly, the frequency of 125 KHz as described in embodiments of the present disclosure is not limited to 125 KHz only. Due to different characteristics of carrier signal transmitting apparatuses (such as read/write apparatuses), the carrier signal with the frequency of 125 KHz transmitted thereby should be understood broadly, which means that any carrier signal with a frequency near 125 KHz should belong to the carrier signal with the frequency of 125 KHz as described in embodiments of the present disclosure. For example, a carrier signal with a frequency within the range of 125 KHz+n KHz should belong to the carrier signal with the frequency of 125 KHz as described in present disclosure, where n is a preset value.

At S802, the carrier signal is amplified, and analog-to-digital conversion is performed on the amplified carrier signal to obtain a digital signal.

As the frequency of the carrier signal transmitted by the carrier signal transmitting apparatus is 125 KHz, while the signal responding apparatus uses the antenna with the resonance frequency of 13.56 MHz, the amplitude of the carrier signal received by the signal responding apparatus via the antenna with the resonance frequency of 13.56 MHz is too small to be identified by the signal responding apparatus. Therefore, the carrier signal received by the signal responding apparatus needs to be amplified, so as to amplify the amplitude of the carrier signal to enable the signal responding apparatus to identify the carrier signal. In a specific implementation, the amplification of the carrier signal may be implemented by an amplifier or a peripheral circuit.

After the carrier signal is amplified by the signal responding apparatus, the amplified carrier signal (such as a sine wave) is subjected to the analog-to-digital conversion to form the digital signal (such as a square wave), so that transmission information of the carrier signal transmitting apparatus may be obtained. This transmission information may include information in a preset format for instructing the signal responding apparatus to make a response, and may also include data transmitted to the signal responding apparatus, which is not specifically limited in the present disclosure. In a specific implementation, the analog-to-digital conversion of the amplified carrier signal may be implemented by a comparator and a peripheral circuit, or may be implemented by an A/D sampling circuit, which is not specifically limited in the present disclosure, and any implementation by which the analog-to-digital conversion of the amplified carrier signal may be performed to obtain the digital signal should belong to the protection scope of the present disclosure.

At S803, a signal characteristic of the carrier signal is acquired according to the digital signal, where the signal characteristic of the carrier signal includes at least a frequency and a phase.

Due to different characteristics of carrier signal transmitting apparatuses, characteristics of carrier signals transmitted by these apparatuses are also different. Therefore, when receiving a carrier signal transmitted by a carrier signal transmitting apparatus, the signal responding apparatus also needs to acquire a signal characteristic of the carrier signal. The signal characteristic includes at least a frequency and a phase of the carrier signal. After acquiring the signal characteristic of the received carrier signal, the signal responding apparatus is able to acquire a characteristic of the carrier signal transmitting apparatus interacting therewith, and transmit information to the carrier signal transmitting apparatus according to the same characteristic as the carrier signal transmitting apparatus to complete the information interaction. For example, if the frequency of the carrier signal transmitted by the carrier signal transmitting apparatus is 125.3 KHz, the signal responding apparatus, after receiving the carrier signal, acquires the frequency of the carrier signal to be 125.3 KHz, so that the signal responding apparatus may subsequently use a response signal with a frequency of 125.3 KHz to respond to the carrier signal transmitting apparatus.

In a specific implementation, when the analog-to-digital conversion of the amplified carrier signal is implemented by the comparator and the peripheral circuit, the signal responding apparatus may determine the characteristic of the carrier signal according to the square wave output by the comparator; when the analog-to-digital conversion of the amplified carrier signal is implemented by the A/D sampling circuit, the signal responding apparatus may determine the characteristic of the carrier signal according to the sine wave obtained by sampling.

At S804, response data is encoded at the frequency of the carrier signal to obtain an encoded signal, an initial phase to output the encoded signal is determined based on the phase of the carrier signal, and the encoded signal is output via the antenna, such that the encoded signal and the carrier signal are superposed at a same phase.

In order to respond to the carrier signal transmitting apparatus, the signal responding apparatus needs to encode the response data at the same frequency as the carrier signal, and transmit the encoded signal at the same phase as the carrier signal, so as to ensure that the encoded signal and the carrier signal are superposed at the same phase to enhance the amplitude of the carrier signal, such that the carrier signal transmitting apparatus is capable of acquiring the signal transmitted by the signal responding apparatus, thereby completing information transmission from the signal responding apparatus to the carrier signal transmitting apparatus. Preferably, a phase difference between the initial phase and the phase of the carrier signal is 0, such that the encoded signal and the carrier signal are completely coincident and superposed at a same phase to enhance the amplitude of the carrier signal, thereby facilitating the carrier signal transmitting apparatus to acquire the signal transmitted by the signal responding apparatus.

Therefore, with the signal responding method according to the present disclosure, the antenna in small size with the resonance frequency of 13.56 MHz may be used to receive and transmit signals with the frequency of 125 KHz, thereby meeting requirement of miniaturization of a device.

As an alternative implementation of the present disclosure, the response data is a unique identification number. In such a case, the carrier signal transmitting apparatus may be a read/write apparatus, such as a card reader; and the signal responding apparatus may respond to the card reader as an ID card. The unique identification number may be an ID number, such as an identification card number, etc.

Embodiment 4

Figure 9:
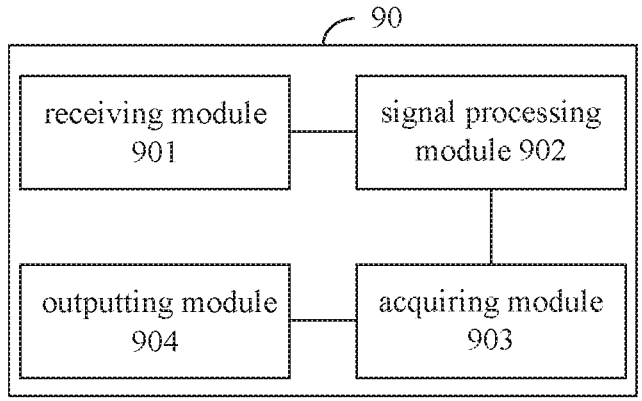
FIG. 9 is a schematic diagram of a signal responding apparatus according to Embodiment 4 of the present disclosure.

This embodiment provides a signal responding apparatus. FIG. 9 shows a schematic diagram of a signal responding apparatus according to an embodiment of the present disclosure, as illustrated in FIG. 9, the signal responding apparatus 90 includes: a receiving module 901, configured to receive a carrier signal with a frequency of 125 KHz via an antenna with a resonance frequency of 13.56 MHz; a signal processing module 902, configured to amplify the carrier signal and perform analog-to-digital conversion on the amplified carrier signal to obtain a digital signal; an acquiring module 903, configured to acquire, according to the digital signal, a signal characteristic of the carrier signal which includes at least a frequency and a phase; and an outputting module 904, configured to encode response data at the frequency of the carrier signal to obtain an encoded signal, determine an initial phase to output the encoded signal based on the phase of the carrier signal, and output the encoded signal via the antenna, such that the encoded signal and the carrier signal are superposed at a same phase.

Since the antenna with the resonance frequency of 13.56 MHz is smaller than an antenna with a resonance frequency of 125 KHz in size, the antenna with the resonance frequency of 13.56 MHz may be applied to a small device, so as to prevent influence of an overlarge antenna on miniaturization design. Therefore, in embodiments of the present disclosure, the signal responding apparatus 90 is provided with the antenna with the resonance frequency of 13.56 MHz to perform signal reception and transmission through the antenna with the resonance frequency of 13.56 MHz. Of course, the antenna with the resonance frequency of 13.56 MHz provided according to the present disclosure is also capable of normally receiving a carrier signal with a frequency of 13.56 MHz, so that the apparatus may achieve dual mode.

It should be illustrated that, the resonance frequency of 13.56 MHz as described in embodiments of the present disclosure is not limited to 13.56 MHz only. Due to different characteristics of antennas, the antenna with the resonance frequency of 13.56 MHz should be understood broadly herein, which means that any antenna with a resonance frequency near 13.56 MHz should belong to the antenna with the resonance frequency of 13.56 MHz as described in embodiments of the present disclosure. For example, an antenna with a resonance frequency within the range of 13.56 MHz±7 KHz should belong to the antenna with the resonance frequency of 13.56 MHz as described in present disclosure. Similarly, the frequency of 125 KHz as described in embodiments of the present disclosure is not limited to 125 KHz only. Due to different characteristics of carrier signal transmitting apparatuses (such as read/write apparatuses), the carrier signal with the frequency of 125 KHz transmitted by these apparatuses also should be understood broadly, which means that any carrier signal with a frequency near 125 KHz should belong to the carrier signal with the frequency of 125 KHz as described in embodiments of present disclosure. For example, a carrier signal with a frequency within the range of 125 KHz n KHz should belong to the carrier signal with the frequency of 125 KHz as described in present disclosure, where n is a preset value.

As the frequency of the carrier signal transmitted by the carrier signal transmitting apparatus is 125 KHz, while the receiving module 901 uses the antenna with the resonance frequency of 13.56 MHz, an amplitude of the carrier signal received by the antenna with the resonance frequency of 13.56 MHz is too small to be identified by the signal responding apparatus 90. Therefore, the carrier signal received by the signal responding apparatus 90 needs to be amplified by the signal processing module 902, so as to amplify the amplitude of the carrier signal to enable the carrier signal to be identified by the signal responding apparatus 90. After amplifying the carrier signal, the signal processing module 902 performs the analog-to-digital conversion on the amplified carrier signal (such as a sine wave) to form the digital signal (such as a square wave), so that transmission information of the carrier signal transmitting apparatus may be obtained. This transmission information may include information in a preset format for instructing the signal responding apparatus 90 to make a response, and may also include data transmitted to the signal responding apparatus 90, which will not be specifically limited in the present disclosure.

As an alternative implementation of the present disclosure, the signal processing module 902 includes at least an amplifier and a comparator; or the signal processing module 902 includes at least an amplifier and a sampling circuit. The specific implementation of the signal processing module 902 will not be limited in the present disclosure, and any implementation by which the carrier signal is amplified and the analog-to-digital conversion of the amplified carrier signal may be performed to obtain the digital signal should belong to the protection scope of the present disclosure.

Due to different characteristics of carrier signal transmitting apparatuses, characteristics of the carrier signals transmitted by these apparatuses are also different. Therefore, when receiving a carrier signal transmitted by a carrier signal transmitting apparatus, the signal responding apparatus 90 also needs to acquire a signal characteristic of the carrier signal. The signal characteristic includes at least a frequency and a phase of the carrier signal. After the signal characteristic of the received carrier signal is acquired by the acquiring module 903, the signal responding apparatus 90 is able to acquire a characteristic of the carrier signal transmitting apparatus interacting therewith, and transmit information to the carrier signal transmitting apparatus according to the same characteristic as the carrier signal transmitting apparatus to complete information interaction. For example, if the frequency of the carrier signal transmitted by the carrier signal transmitting apparatus is 125.3 KHz, the carrier signal, after received by the receiving module 901, is processed by the signal processing module 902, and the acquiring module 903 acquires the frequency of the carrier signal to be 125.3 KHz, so that the signal responding apparatus 90 may subsequently use a response signal with a frequency of 125.3 KHz to respond to the carrier signal transmitting apparatus.

In a specific implementation, when the analog-to-digital conversion of the amplified carrier signal is implemented by a comparator and a peripheral circuit, the acquiring module 903 may determine the characteristic of the carrier signal according to the square wave output by the comparator; when the analog-to-digital conversion of the amplified carrier signal is implemented by an A/D sampling circuit, the acquiring module 903 may determine the characteristic of the carrier signal according to the sine wave obtained by sampling.

In order to respond to the carrier signal transmitting apparatus, the outputting module 904 of the signal responding apparatus 90 needs to encode the response data at the same frequency as the carrier signal, and transmit the encoded signal at the same phase as the carrier signal, so as to ensure that the encoded signal and the carrier signal are superposed at the same phase to enhance the amplitude of the carrier signal, such that the carrier signal transmitting apparatus is capable of acquiring the signal transmitted by the signal responding apparatus 90, thereby completing information transmission from the signal responding apparatus 90 to the carrier signal transmitting apparatus. Preferably, a phase difference between the initial phase and the phase of the carrier signal is 0, such that the encoded signal and the carrier signal are completely coincident and superposed at a same phase to enhance the amplitude of the carrier signal, thereby facilitating the carrier signal transmitting apparatus to acquire the signal transmitted by the signal responding apparatus 90.

Therefore, with the signal responding apparatus 90 according to the present disclosure, the antenna in small size with the resonance frequency of 13.56 MHz may be used to receive and transmit signals with the frequency of 125 KHz, thereby meeting requirement of miniaturization of a device.

As an alternative implementation of the present disclosure, the response data is a unique identification number. In such a case, the carrier signal transmitting apparatus may be a read/write apparatus, such as a card reader; and the signal responding apparatus 90 may respond to the card reader as an ID card. The unique identification number may be an ID number, such as an identification card number, etc.

Embodiment 5

Figure 10:
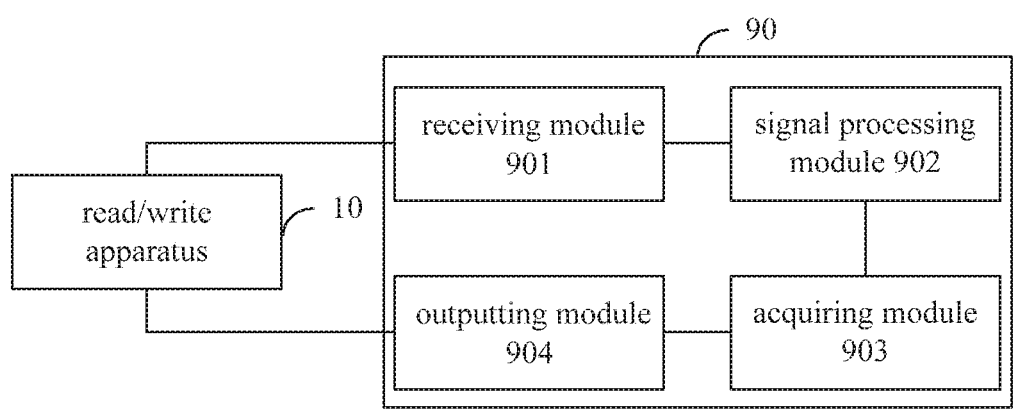
FIG. 10 is a schematic diagram of a signal responding system according to Embodiment 5 of the present disclosure.

This embodiment provides a signal responding system. FIG. 10 shows a schematic diagram of a signal responding system according to an embodiment of the present disclosure, as illustrated in FIG. 10, the signal responding system includes a read/write apparatus 10 and a signal responding apparatus 90. The signal responding apparatus 90 is the signal responding apparatus as described above and will not be elaborated herein. The read/write apparatus 10 is configured to transmit a carrier signal with a frequency of 125 KHz and receive an encoded signal.

With the signal responding system provided by embodiments of the present disclosure, information interaction is achieved while ensuring miniaturization of a device.

Reference throughout this specification to "an embodiment," "some embodiments," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

Although embodiments of the present disclosure have been shown and described above, it would be appreciated that the above embodiments are illustrative, cannot be construed to limit the present disclosure, and changes, modifications, alternatives, and variants can be made in the embodiments by those skilled in the art without departing from spirit, principles and scope of the present disclosure. The scope of the present disclosure is defined by the appended claims and equivalents thereof.

What is claimed is:

1. A signal transceiving device, comprising: an antenna coil with a resonance frequency of 13.56 MHz, an amplification circuit, an analog-to-digital conversion circuit, a first direct current DC blocking circuit, a second DC blocking circuit, a DC power supply and a micro control unit MCU, wherein the DC power supply is electrically connected with each of the amplification circuit, the analog-to-digital conversion circuit and the MCU, and configured to supply power to each of the amplification circuit, the analog-to-digital conversion circuit and the MCU;

the antenna coil is configured to receive a carrier signal with a frequency of 125 KHz;

the second DC blocking circuit is electrically connected with the antenna coil at a first end of the second DC blocking circuit and electrically connected with an input end of the amplification circuit at a second end of the second DC blocking circuit, and configured to transmit the carrier signal to the amplification circuit;

the amplification circuit is electrically connected with the second DC blocking circuit at the input end of the amplification circuit, and configured to amplify the carrier signal and output the amplified carrier signal via an output end of the amplification circuit;

the analog-to-digital conversion circuit is electrically connected with the output end of the amplification circuit at an input end of the analog-to-digital conversion circuit, and configured to perform analog-to-digital conversion on the carrier signal amplified by the amplification circuit to obtain a digital signal, and output the digital signal via an output end of the analog-to-digital conversion circuit;

the MCU is electrically connected with the output end of the analog-to-digital conversion circuit at a receiving port of the MCU, and configured to acquire, according to the digital signal, a signal characteristic of the carrier signal which comprises at least a frequency and a phase, encode date to be output at the frequency of the carrier signal to obtain an encoded signal, determine an initial phase to output the encoded signal based on the phase of the carrier signal, and output the encoded signal from a transmitting port of the MCU; and the first DC blocking circuit is electrically connected with the transmitting port of the MCU at a first end of the first DC blocking circuit and electrically connected with the antenna coil at a second end of the first DC blocking circuit, and configured to transmit the encoded signal to the antenna coil.

2. The signal transceiving device according to any one of claim 1, wherein the analog-to-digital conversion circuit comprises an A/D sampling circuit or a voltage comparing circuit.

3. The signal transceiving device according to claim 1, further comprising:
a transceiving circuit, electrically connected with the antenna coil, and configured to receive and transmit signals with a frequency of 13.56 MHz; and
a card reader and card chip with a frequency of 13.56 MHz, electrically connected with the transceiving circuit, and configured to analyze a signal received by the transceiving circuit and encode a signal transmitted by the transceiving circuit.

4. The signal transceiving device according to claim 3, further comprising:
a rectifying unit, electrically connected with the antenna coil at an input end of the rectifying unit, and configured to receive and rectify an alternating current AC signal output by the antenna coil, and output a DC signal via an output end of the rectifying unit.

5. The signal transceiving device according to claim 4, further comprising:
a charging port, electrically connected with the output end of the rectifying unit, and configured to obtain electrical energy from the rectifying unit.

6. The signal transceiving device according to claim 5, further comprising:
a switching unit, electrically connected between the output end of the rectifying unit and the charging port, and configured to turn on or off an electrical connection between the rectifying unit and the charging port.

7. A signal transceiving device, comprising: an antenna coil with a resonance frequency of 13.56 MHz, an amplification circuit, an analog-to-digital conversion circuit, a first direct current DC blocking circuit, a driving unit, a second DC blocking circuit, a DC power supply and a micro control unit MCU, wherein
the DC power supply is electrically connected with each of the amplification circuit, the analog-to-digital conversion circuit, the driving unit and the MCU, and configured to supply power to each of the amplification circuit, the analog-to-digital conversion circuit, the driving unit and the MCU;

the antenna coil is configured to receive a carrier signal with a frequency of 125 KHz;

the second DC blocking circuit is electrically connected with the antenna coil at a first end of the second DC blocking circuit and electrically connected with an input end of the amplification circuit at a second end of the second DC blocking circuit, and configured to transmit the carrier signal to the amplification circuit;

the amplification circuit is electrically connected with the second DC blocking circuit at the input end of the amplification circuit, and configured to amplify the carrier signal and output the amplified carrier signal via an output end of the amplification circuit;

the analog-to-digital conversion circuit is electrically connected with the output end of the amplification circuit at an input end of the analog-to-digital conversion circuit, and configured to perform analog-to-digital conversion on the carrier signal amplified by the amplification circuit to obtain a digital signal, and output the digital signal via an output end of the analog-to-digital conversion circuit;

the MCU is electrically connected with the output end of the analog-to-digital conversion circuit at a receiving port of the MCU, and configured to acquire, according to the digital signal, a signal characteristic of the carrier signal which comprises at least a frequency and a phase, encode date to be output at the frequency of the carrier signal to obtain an encoded signal, determine an initial phase to output the encoded signal based on the phase of the carrier signal, and output a control signal from a transmitting port of the MCU according to the encoded signal and the initial phase;

the driving unit is electrically connected with the transmitting port of the MCU at an input end of the driving unit and electrically connected with the first DC blocking circuit at an output end of the driving unit, and configured to output the encoded signal from the output end of the driving unit under control of the control signal; and the first DC blocking circuit is electrically connected with the output end of the driving unit at a first end of the first DC blocking circuit and electrically connected with the antenna coil at a second end of the first DC blocking circuit, and configured to transmit the encoded signal to the antenna coil.

8. The signal transceiving device according to claim 7, wherein the driving unit comprises:
an on-off module, comprising:
a first end, being the output end of the driving unit, and electrically connected with each of the first DC blocking circuit and the DC power supply;
a second end, electrically connected with a ground terminal; and
a control end, being the input end of the driving unit and electrically connected with the transmitting port of the MCU,
wherein the on-off module is configured to turn on or off an electrical connection between the first end and the second end of the on-off module under control of the control signal.

9. The signal transceiving device according to claim 8, wherein the analog-to-digital conversion circuit comprises an A/D sampling circuit or a voltage comparing circuit.

10. The signal transceiving device according to claim 8, further comprising:
- a transceiving circuit, electrically connected with the antenna coil, and configured to receive and transmit signals with a frequency of 13.56 MHz; and
- a card reader and card chip with a frequency of 13.56 MHz, electrically connected with the transceiving circuit, and configured to analyze a signal received by the transceiving circuit and encode a signal transmitted by the transceiving circuit.

11. The signal transceiving device according to claim 10, further comprising:
- a rectifying unit, electrically connected with the antenna coil at an input end of the rectifying unit, and configured to receive and rectify an alternating current AC signal output by the antenna coil, and output a DC signal via an output end of the rectifying unit.

12. The signal transceiving device according to claim 11, further comprising:
- a charging port, electrically connected with the output end of the rectifying unit, and configured to obtain electrical energy from the rectifying unit; and
- a switching unit, electrically connected between the output end of the rectifying unit and the charging port, and configured to turn on or off an electrical connection between the rectifying unit and the charging port.

13. The signal transceiving device according to claim 7, wherein the analog-to-digital conversion circuit comprises an A/D sampling circuit or a voltage comparing circuit.

14. The signal transceiving device according to claim 7, further comprising:
- a transceiving circuit, electrically connected with the antenna coil, and configured to receive and transmit signals with a frequency of 13.56 MHz; and
- a card reader and card chip with a frequency of 13.56 MHz, electrically connected with the transceiving circuit, and configured to analyze a signal received by the transceiving circuit and encode a signal transmitted by the transceiving circuit.

15. The signal transceiving device according to claim 14, further comprising:
- a rectifying unit, electrically connected with the antenna coil at an input end of the rectifying unit, and configured to receive and rectify an alternating current AC signal output by the antenna coil, and output a DC signal via an output end of the rectifying unit.

16. The signal transceiving device according to claim 15, further comprising:
- a charging port, electrically connected with the output end of the rectifying unit, and configured to obtain electrical energy from the rectifying unit.

17. The signal transceiving device according to claim 16, further comprising:
- a switching unit, electrically connected between the output end of the rectifying unit and the charging port, and configured to turn on or off an electrical connection between the rectifying unit and the charging port.

18. A signal responding method, comprising:
- receiving a carrier signal with a frequency of 125 KHz via an antenna with a resonance frequency of 13.56 MHz;
- amplifying the carrier signal and performing analog-to-digital conversion on the amplified carrier signal to obtain a digital signal;
- acquiring, according to the digital signal, a signal characteristic of the carrier signal which comprises at least a frequency and a phase; and
- encoding response data at the frequency of the carrier signal to obtain an encoded signal, determining an initial phase to output the encoded signal based on the phase of the carrier signal, and outputting the encoded signal via the antenna, such that the encoded signal and the carrier signal are superposed at a same phase.

19. The signal responding method according to claim 18, wherein a phase difference between the initial phase and the phase of the carrier signal is 0.

20. The signal responding method according to claim 18, wherein the response data is a unique identification number.

\* \* \* \* \*